United States Patent
Wuidart et al.

[11] Patent Number: 5,467,053
[45] Date of Patent: Nov. 14, 1995

[54] CIRCUIT FOR FILTERING A SIGNAL AND INTEGRATED CIRCUIT COMPRISING SUCH A CIRCUIT

[75] Inventors: Sylvie Wuidart, Pourrieres; Tien-Dung Do, Aix-en-Provence, both of France

[73] Assignee: SGS-Thomson Microelectronics, SA, Cedex, France

[21] Appl. No.: 286,485

[22] Filed: Aug. 4, 1994

[30] Foreign Application Priority Data

Aug. 5, 1993 [FR] France .................... 93 09680

[51] Int. Cl.[6] .............. H03K 3/017; H03K 5/14
[52] U.S. Cl. ............ 327/551; 327/34; 327/311; 327/277; 364/724.01
[58] Field of Search .................... 327/552, 34, 551, 327/310, 311, 392, 394, 18, 276, 261, 277, 283, 31; 326/104; 364/572, 724.01

[56] References Cited

U.S. PATENT DOCUMENTS

| | | | |
|---|---|---|---|
| 4,795,915 | 1/1989 | Sun et al. .................... 327/34 |
| 5,130,582 | 7/1992 | Ishihara et al. .................... 322/262 |
| 5,225,715 | 6/1993 | Mori et al. .................... 327/34 |

FOREIGN PATENT DOCUMENTS 514714 of 0000 European Pat. Off. .
309849 of 0000 European Pat. Off. .

OTHER PUBLICATIONS

Funkschau, vol. 50, No. 12, Jun. 1978, Munchen DE, p. 578, H. Glunder, "Schaltung zur Kontaktenprellung".

Primary Examiner—Timothy P. Callahan
Assistant Examiner—Dinh T. Le
Attorney, Agent, or Firm—Robert Groover; Betty Formby

[57] ABSTRACT

A circuit for the filtering of a pulse signal comprises means to detect an output pulse upon the detection of an input pulse, the shape of this output pulse being based on elementary delays obtained by the charging and discharging of capacitors. During the generation of the output pulse, no new input pulse can be taken into account.

20 Claims, 3 Drawing Sheets

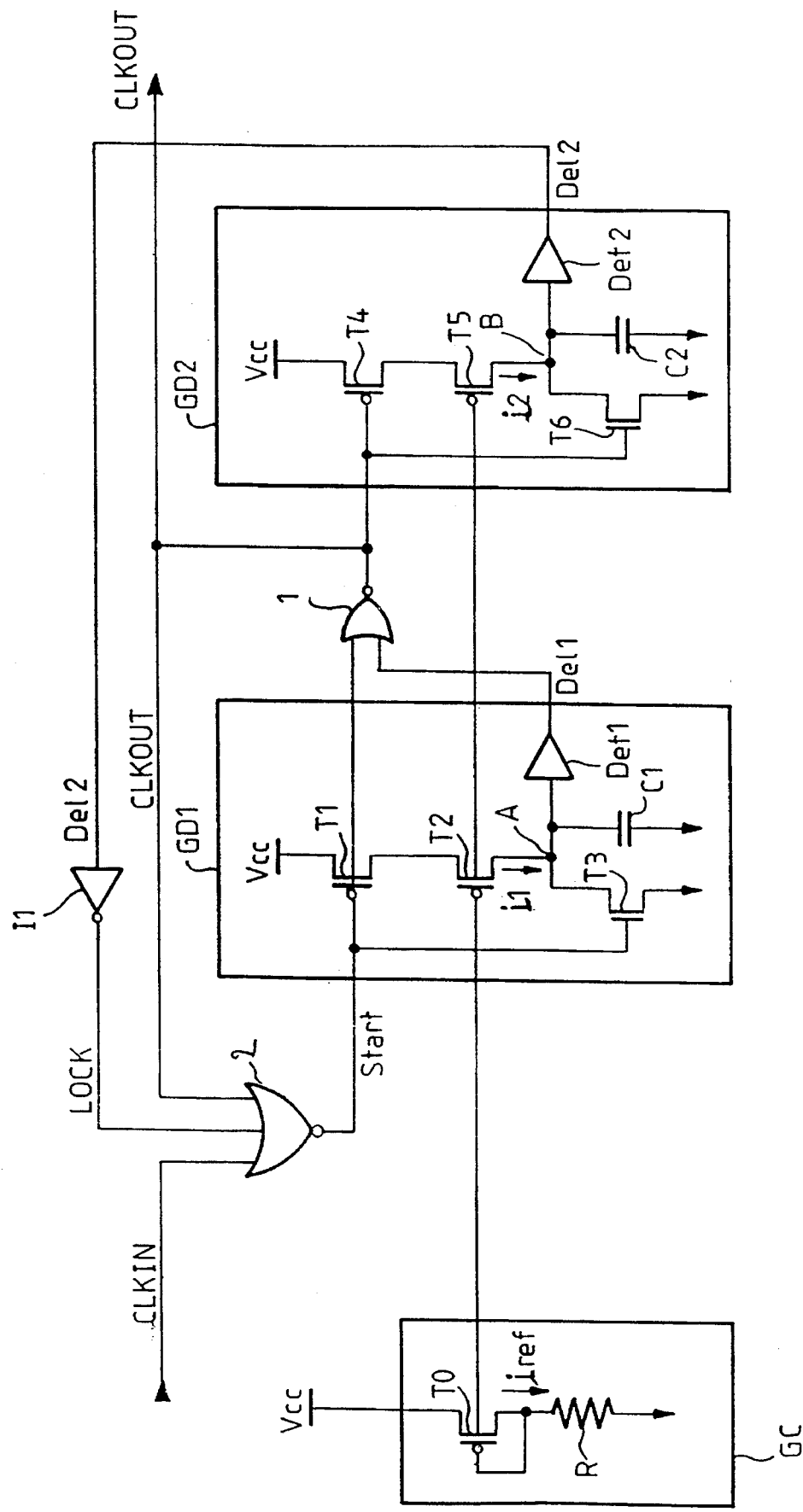
FIG_1

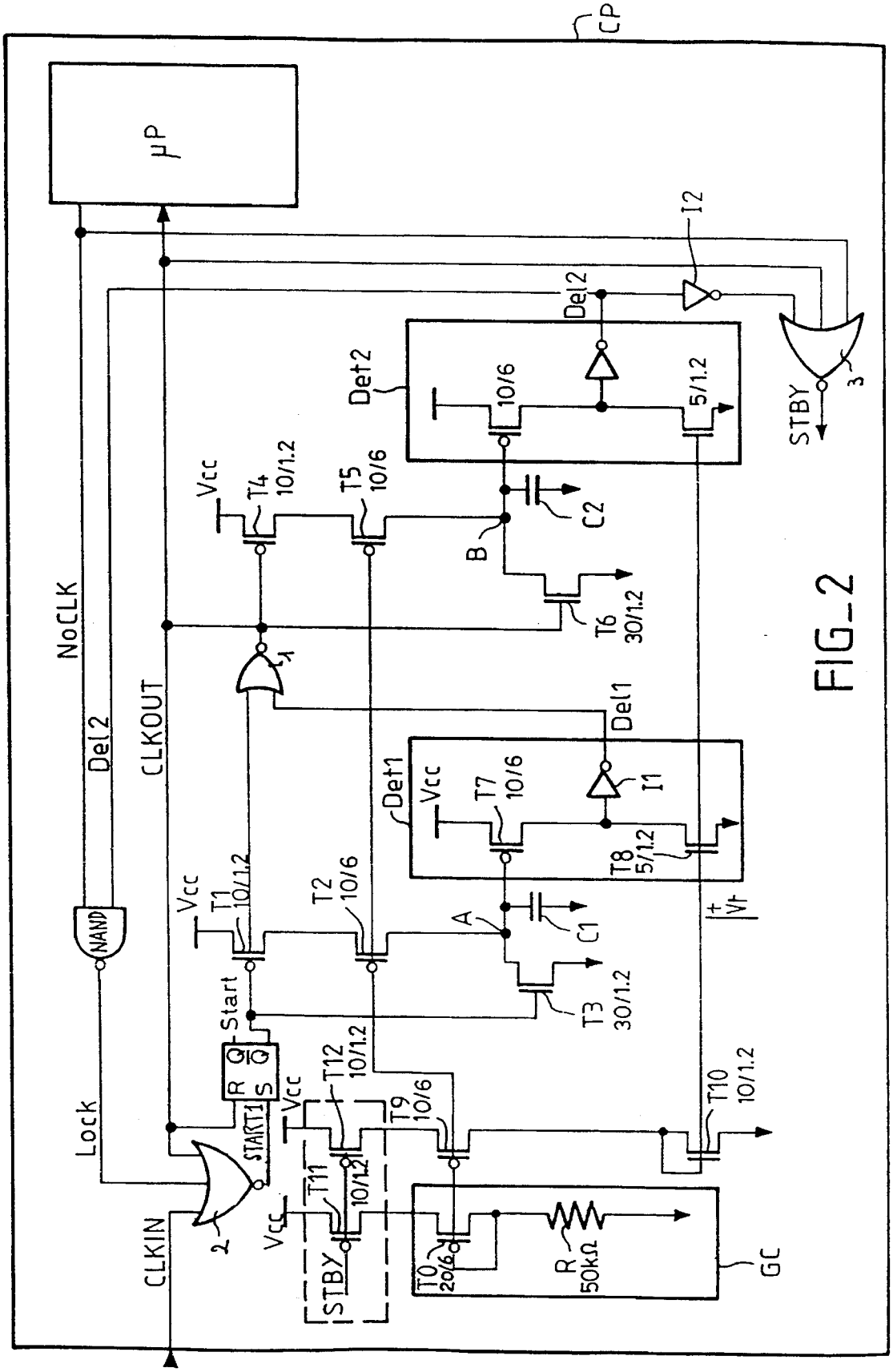
FIG_2

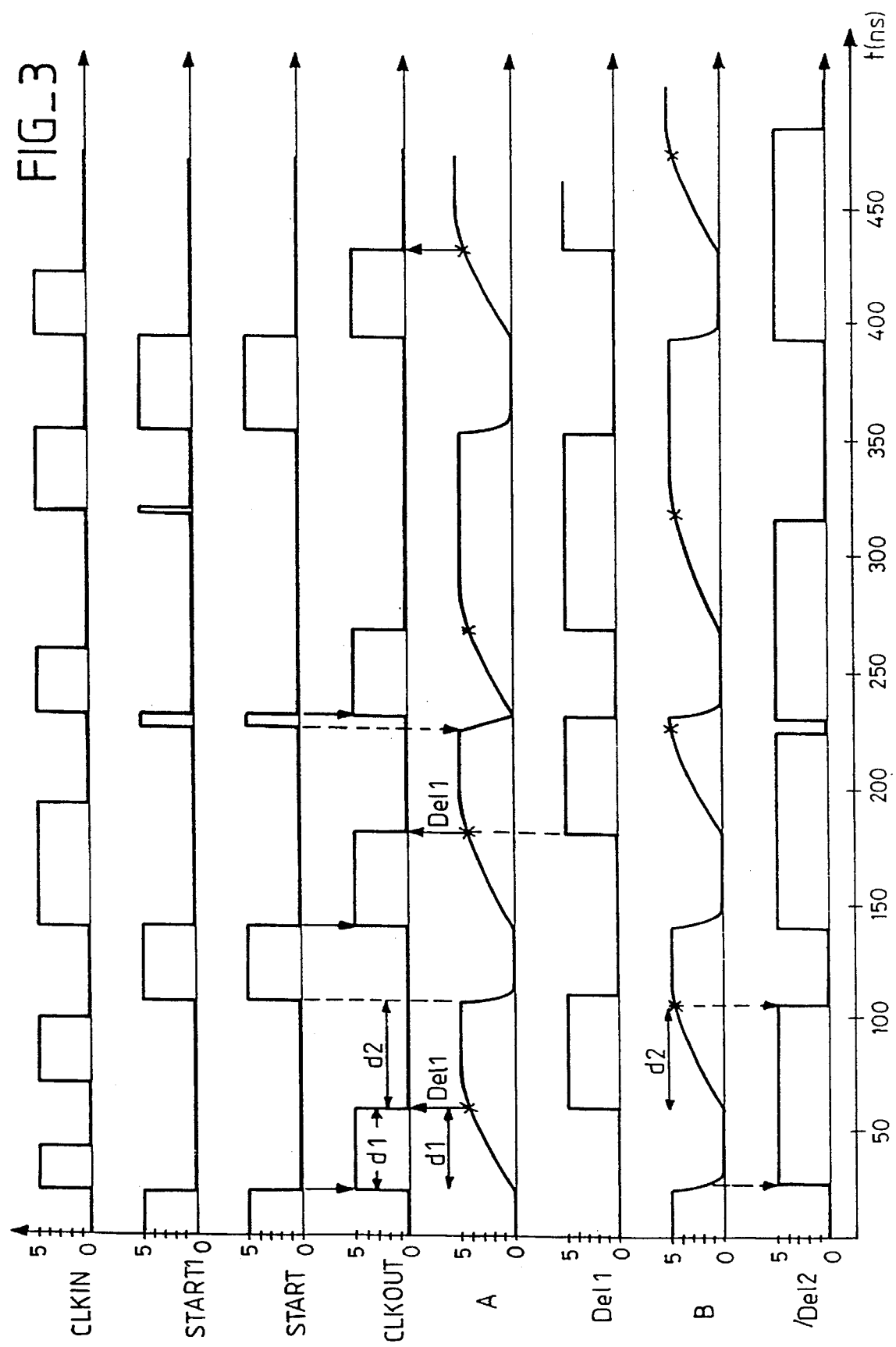

CIRCUIT FOR FILTERING A SIGNAL AND INTEGRATED CIRCUIT COMPRISING SUCH A CIRCUIT

BACKGROUND OF THE INVENTION

The present invention relates to a circuit for the filtering of a pulse signal. It can be applied especially in chip cards or smart cards, notably for the filtering of the clock signal.

The invention relates especially to circuits that require a pulse signal for which the high and low states of the pulses are stable for a minimal fixed period. This is especially the case with circuits designed for chip cards such as credit cards or phone cards for which it is absolutely necessary to foresee and prevent any fraud. Now, without the efficient and reliable filtering of the clock signal applied to a chip card, a fraudulent individual could interfere with this external clock signal by means of very short pulses which, if taken into account internally by the circuit, could for example enable the fraudulent individual to gain access to unauthorized functions.

A known way of carrying out filtering operations such as these is to use phase-locking circuits with low-frequency filters. However, these circuits are complex and they most usually require discrete components, notably for making low-frequency filters. Their operation is reliable for characteristics of the input signal that are well delimited within a restricted and specified zone. Beyond this zone, their reliability is no longer assured.

To resolve these technical problems, the invention proposes a circuit for filtering a pulse signal that delivers a pulse signal at output for which the high and low states of the pulses have a guarantied minimal duration that is independent of the characteristics of the input signal.

According to the invention, the generation of an output pulse is activated by the detection of an input pulse and the form of the output pulse is based on elementary delays obtained by the charging of capacitors. However, throughout the duration of the elementary delays, no input pulse can be taken into account.

SUMMARY OF THE INVENTION

As characterized, the invention relates to a circuit for filtering an input pulse signal. According to the invention, this filtering circuit comprises:

- a stage for the generation of a first delay, comprising a first capacitor whose charging and discharging are controlled by a first control signal, one of the terminals of the capacitor being connected to a non-inverter level detector to deliver a first delay signal, the other terminal being connected to the ground;
- a stage to generate a second delay comprising a second capacitor whose charging and discharging are controlled by a second control signal, one of the terminals of the capacitor being connected to a second non-inverter level detector to deliver a second delay signal, the other terminal being connected to the ground;
- a first OR type logic gate (1) receiving the first control signal and the first delay signal at input and delivering, at output, the second control signal which is the output pulse signal;
- a second OR type logic gate (2) receiving the input pulse signal, the output pulse signal and a locking signal controlled by the second delay signal at input and delivering the first control signal at output.

Advantageously, the charging is done at constant current.

Preferably, in order that the discharging of the first capacitor may be complete before a new pulse of the input pulse signal is taken into account, an RS type flip-flop circuit is placed at output of the second logic gate to deliver the first control signal. In this way, an excessively short pulse at output of the second logic gate will not be taken into account by the flip-flop circuit, thus preventing a new pulse in the input pulse signal from being taken into account.

The filtering circuit is advantageously included in an integrated circuit and furthermore comprises logic means to prevent the consumption of current during delays when the output pulse signal is not needed for the operation of the integrated circuit.

BRIEF DESCRIPTION OF THE DRAWINGS

Other features and characteristics of the invention are described in detail in the following description, given by way of an indication that in no way restricts the scope of the invention and made with reference to the appended drawings, of which:

FIG. 1 is an electronic diagram of a filtering circuit according to the invention;

FIG. 2 is an electronic diagram of an integrated circuit comprising a filtering circuit according to the invention; and FIG. 3 is a timing diagram of the different signals of FIG. 2.

MORE DETAILED DESCRIPTION

A filtering circuit according to the invention comprises, as shown in FIG. 1:

- a stage GD1 for the generation of a first delay d1 comprising a first capacitor C1 the charging and discharging of which are controlled by a first control signal Start, one of the terminals of the capacitor being connected to a first non-inverter level detector Det 1 to deliver a first delay signal Del1, the other terminal being connected to the ground;
- a stage GD2 for the generation of a second delay d2 comprising a second capacitor C2 whose charging and discharging are controlled by a second control signal CLKOUT, one of the terminals of the capacitor being connected to a second non-inverter level detector Det2, to deliver a second delay signal Del2, the other terminal being connected to the ground;
- a first NOR type logic gate (1) receiving the first control signal Start and the first delay signal Del1 at input and delivering the second control signal CLKOUT which is also the output pulse signal;
- a second NOR logic gate (2) receiving, at input, the input pulse signal CLKIN, the output pulse signal CLKOUT and a locking signal LOCK activated by the second delay signal Del2 and delivering the first control signal Start at output.

In the example of FIG. 1, where the operation is in the positive logic state (namely the high state) and where the control signals Start and CLKOUT control, as shall be seen hereinafter, P type MOS transistors, the logic gates 1 and 2 are NOR gates and the locking signal LOCK is the reverse of the second delay signal Del2 obtained by an inverter gate I1.

The general principle of operation shall now be explained with the logic chosen in the example of FIG. 1 (NOR gates). It is assumed that the conditions; at the outset are such that the capacitor C1 is discharged and that the inputs CLKIN, CLKOUT and LOCK (/Del2) of the gate 2 are at zero. The output Del1 of the non-inverter detector Det1 is then at the logic 0 level and the output Start of the gate 2 is at the logic 1 level.

When a pulse (indicating a change to the high state) appears in the input pulse signal CLKIN, the output Start of the gate 2 goes to zero. This activates, firstly, the passage to "1" of the output pulse signal CLKOUT at output of the gate 1 and, secondly, the charging of the capacitor C1. The passing to "1" of the output pulse signal CLKOUT then activates the discharging of the capacitor C2. The non-inverter detector Det2 detects a low level at input and makes its output Del2 go to "0". The locking signal LOCK (/Del2) is then at "1". This maintains a level 0 at output Start of the gate 2, whatever may be the respective states of the pulse signals CLKIN and CLKOUT.

When a sufficient potential appears at the terminals of the capacitor C1, the non-inverter detector Det1 detects a high level at input and makes its output Del1 go to "1". This delay signal Del1 then activates the passing, to the logic 0 level, of the output pulse signal CLKOUT at output of the gate 1.

The high state of the output pulse signal CLKOUT therefore has a duration d1 that is perfectly determined by the charging of the capacitor C1.

The passing to the logic 0 level of the output pulse signal CLKOUT will then activate the charging of the capacitor C2. When a sufficient potential appears at the terminals of the capacitor, the non-inverter detector Det2 detects a high level and the delay signal Del2 at output goes to "1".

The signals CLKOUT and LOCK (/Del2) are then both at zero and it is possible to take account of a new pulse in the input pulse signal CLKIN.

Thus, as soon as an input pulse CLKIN has been taken into account, the second delay signal Del2 prevents any new pulse from being taken into account so long as the delay d1+d2 is not over.

There is thus an output pulse signal CLKOUT whose high state has a duration d1 determined by the first delay generation stage GD1 and whose low state has a duration which is at least equal to the duration d2 determined by the second delay generation stage GD2.

In the example shown in FIG. 1, the filtering circuit is made by means of MOS or CMOS technology. In this example, a time-delay generation stage, for example the stage GD1, comprises:

a first MOS transistor T1 and a second MOS transistor T2 series-connected between the supply voltage VCC and a node A; the gate of the first transistor T1 is connected to the first control signal Start and the gate of the second transistor T2 is connected to the output of a reference current generator GC;

a third MOS transistor T3 is connected between the node A and the ground, its gate being controlled by the first control signal Start;

a capacitor C1 is connected between the node A and the ground; and a non-inverter level detector Det1 is connected at input to the node A and delivers the first delay signal Del1 at output.

In the example shown, the first and second transistors are P type transistors and the third transistor is an N type transistor.

The second delay generation stage GD2 has a structure similar to the one that has just been described, using the transistors referenced T4, T5, T6, a node referenced B, the capacitor C2 and the non-inverter level detector Det2, and using the output pulse signal CLKOUT as a control signal.

The principle of operation is simple: if the first control signal Start is at 1, the first P type transistor T1 (or T4) is off. This also turns the second P type transistor T2 (or T5) of the stage off. The third N type transistor T3 (or T6) is on and the capacitor gets discharged through this transistor. The N type transistor T3 (or T6) is therefore preferably wide so that it lets through a great deal of current, for swift discharging.

If the first control signal is at zero, the P type transistors T1 and T2 (or T4 and T5) are on while the N type transistor T3 (or T6) is off: the capacitor gets charged. The charging current is preferably controlled and fixed by a reference current generator GC. The structure chosen for the example of FIG. 1 is a current mirror structure that makes it possible to dictate a fixed charging current i1 that does not vary with the supply voltage.

More specifically, the reference current generator GC shown in FIG. 1 for a filtering circuit made by means of MOS or CMOS technology has a reference MOS transistor T0 whose gate and drain are connected together to the ground by a charging resistor R, the source being connected to the supply voltage VCC. This approach results in the imposing of a reference current iref in the current generator. This reference current is copied (according to geometry ratio scaling of the transistors) in each of the delay generation stages: i1 in the first stage GD1 and i2 in the second stage GD2.

The principle of the current mirror, which is well known, shall not be developed in greater detail. However, it will be noted that structures of greater complexity may be used for the current generator, such as for example a Wilson mirror structure.

In the example shown, the reference transistor T0 is a P type transistor.

To improve the performance characteristics of the filtering circuit described with reference to FIG. 1, the invention will use, for example, non-inverter level detector structures such as those shown in FIG. 2.

For example, the first level detector Det1 will preferably have:

a P type transistor T7 whose gate is connected to the node A;

an N-type transistor T8 whose gate is biased at the threshold voltage Vt of the transistor;

an inverter I1 which will preferably be a CMOS element.

The transistors T7 and T8 are series-connected between VCC and the ground. The inverter I1 has its input connected to the common drains of the transistors T7 and T8 and delivers the delay signal Del1.

The biasing of the transistor T8 is preferably obtained by an arm comprising a P type transistor T9 mounted as a current mirror with respect to the current generator GC, i.e. having its gate connected to the gate of the reference transistor T0 of the current generator.

The transistor T9 is series-connected between the supply voltage VCC and the ground, with an N type transistor T10 mounted as a diode, i.e. having its gate connected to its drain. The gate of the transistor T10 is furthermore connected to the gate of the N type transistor T8 of the non-inverter level detector Det1.

The same biasing arm will preferably be used for the second non-inverter level detector Det2.

The T10 type transistor thus imposes a voltage in the range of the threshold voltage of an N type transistor on the gate of the N type transistor T8 which, as a result, is biased at the conduction limit. This gate biasing voltage is made constant and independent of the supply voltage VCC through the current-mirror assembly of the transistor T9 with respect to the transistor T0 of the current generator GC.

When the capacitor C1 is discharged, there is a potential of zero at the node A and the P type transistor T7 of the detector Det1 is highly ON, setting up a voltage level close to VCC at its drain: the inverter I1 delivers a zero at output Del1.

When the capacitor C1 gets charged, the P type transistor T7 becomes ever less conductive and the inverter T1 flips over, delivering a logic 1 level at output Del1.

The detector described has a number of advantages contributing to the stability of the signal Del1 which corresponds to the duration of the high level of the output pulse signal CLKOUT. The transistors T7 and T8 are indeed biased by two completely independent levels, each of which is determined by constant currents obtained through the use of a current-mirror structure. However, other types of detector could be used.

In a first improvement shown in FIG. 2, an RS-type flip-flop circuit is placed between the output of the logic gate 2 and the delay generators. This RS-type type flip-flop circuit receives, at its S input, the output signal herein referenced Start1 from the logic gate 2 and, at its resetting input (R), the output pulse signal CLKOUT. At a Q output, it delivers the first control signal Start. In this figure, the output of the gate 2 is referenced Start1.

The value of an RS-type flip-flop circuit such as this is that it makes it possible not to take account of a new pulse CLKIN as soon as the locking signal LOCK (/Del2) has gone back to zero if the interval between the instant when the signal LOCK (/Del2) has gone back to zero and hence the output signal Start1 of the logic gate 2 goes back to 1 and the instant when a new pulse CLKIN appears is not enough to enable a complete discharging of the capacitor C1.

Indeed if the discharging is incomplete, the charging of the capacitor starts while the potential at A is already greater than zero and the delay d1 will be reduced.

The use of an RS-type flip-flop circuit means that if the pulse on the output signal Start1 is too short, the flip-flop circuit will not perceive it and the signal Start at output of the flip-flop circuit will remain at zero. The RS flip-flop circuit is reset by the passing, to the high state, of the output pulse signal CLKOUT, i.e. whenever a pulse CLKIN is taken into account.

The timing diagram shown in FIG. 3 gives a clear view of the exemplary case where a pulse CLKIN will not be taken into account because of the RS flip-flop circuit.

The filtering circuit described will advantageously be contained in an integrated circuit of the chip card (CP) or smart card type (FIG. 2) comprising a microprocessor µP for example.

To limit the consumption of the filtering circuit, the system may be designed so that the microprocessor delivers a signal NOCLK indicating that it has no need of the output pulse signal CLKOUT, in which case the input pulse signal CLKIN does not need to be filtered.

This signal NOCLK will then advantageously be used to inhibit the current generator GC and prevent any pulse in the input pulse signal CLKIN from being taken into account.

The element used for the current generator, for example, will quite simply be a MOS transistor T11 series-connected between VCC and the transistor T0 and controlled, at its gate, by a switch-over signal STBY. In the same way, a MOS transistor T12 will be series-connected between VCC and the transistor T9 of the biasing arm of the detectors Det1 and Det2.

In the example of FIG. 2, the transistors T11 and T12 are P type transistors.

The assumption is that the signal NOCLK is active in the low state. In this case, the signal STBY will be delivered, for example, by a third NOR gate 3 receiving the signals NOCLK, CLKOUT and/Del2 at input. Indeed, if a pulse CLKOUT is being generated, it is necessary to wait for this pulse to be completely generated: it is therefore necessary to wait for the pulse signal CLKOUT to be at zero and for the delay signal Del2 to be at 1 (or/Del2 to be at zero). The inhibition signal NOCLK can then be taken into account: the output signal STBY then takes a level 1 and the P type transistors T11 and T12 are off, thus preventing the generation of any current in the transistors T0 and T9.

It is also necessary to inhibit the delay generator circuits GD1 and GD2 by preventing the signal Start from going to zero. All that has to be done to this end is to set the signal /Del2 at 1 in order to set the output of the gate 2 at 1. The example uses a NAND gate receiving the signals Del2 and NOCLK at input and delivering the signal LOCK at output, this signal LOCK being equal to/Del2 when NOCLK is at 1 and having a level 0 when NOCLK is at 0.

The filtering circuit according to the invention is particularly reliable and enables the filtering of parasitic pulses in the input pulse signal.

Its reliability is improved by the use of current-mirror structures as current generators. It can be made entirely in integrated circuit form and does not require any discrete components.

The resistor R of the current generator will be made for example by diffusion and the capacitors by capa-implant, namely by non-self-aligned diffusion covered with a gate oxide.

An example of numerical values for the geometries of the transistors, the resistor and the capacitors is given in FIG. 2.

What is claimed is:

1. A circuit for filtering an input pulse signal, comprising:

a stage for the generation of a first delay, comprising a first capacitor whose charging and discharging are controlled by a first control signal, one of the terminals of the first capacitor being connected to a first non-inverter level detector to deliver a first delay signal, the other terminal being connected to the ground;

a stage to generate a second delay comprising a second capacitor whose charging and discharging are controlled by a second control signal, one of the terminals of the second capacitor being connected to a second non-inverter level detector to deliver a second delay signal, the other terminal being connected to the ground;

a first NOR type logic gate receiving the first control signal and the first delay signal at input and delivering, at output, the second control signal which is the output pulse signal;

a second NOR type logic gate receiving, at input, the input pulse signal, the output pulse signal and a locking signal controlled by the second delay signal and delivering, at output, the first control signal.

2. A filtering signal according to claim 1, wherein an RS type flip-flop circuit has its input connected to the output of the second NOR gate and delivers the first control signal at an output, its reset input being controlled by the second control signal.

3. The filtering circuit according to claim 1, wherein the locking signal is delivered by an inverter receiving the second delay signal at input.

4. The filtering circuit according to claim 1, wherein the charging of the capacitors is done at constant current controlled by a current generator with a current mirror structure.

5. The filtering circuit of claim 3, wherein at least one of said stages further comprises:

- a first MOS transistor and a second MOS transistor series-connected between a supply voltage and said one terminal of said respective capacitor, the gate of the first transistor being controlled by the respective control signal, the gate of the second transistor being controlled by an output of the current generator;
- a third MOS transistor connected between said one terminal and ground, its gate being controlled by the control signal.

6. The filtering circuit according to claim 3, wherein the current generator comprises a reference MOS transistor, having its gate and its drain connected together, series-connected with a resistive charge between the supply voltage and the ground, the output of the current generator being taken at the drain of the transistor.

7. The filtering circuit according to claim 2, wherein the locking signal is delivered by an inverter receiving the second delay signal at input.

8. The filtering circuit according to claim 2, wherein the charging of the capacitors is done at constant current controlled by a current generator with a current mirror structure.

9. The filtering circuit according to claims 7, wherein at least one of said stages further comprises:

- a first MOS transistor and a second MOS transistor series-connected between a supply voltage and said one terminal of said-respective capacitor, the gate of the first transistor being controlled by the respective control signal, the gate of the second transistor being controlled by an output of the current generator; and
- a third MOS transistor connected between said one terminal and ground, its gate being controlled by the control signal.

10. The-filtering circuit according to claim 4, wherein the current generator comprises a reference MOS transistor having its gate and its drain connected together, series-connected with a resistive charge between the supply voltage and the ground, the output of the current generator being taken at the drain of the transistor.

11. The filtering circuit according to claim 7, wherein the current generator comprises a reference MOS transistor having its gate and its drain connected together, series-connected with a resistive charge between the supply voltage and the ground, the output of the current generator being taken at the drain of the transistor.

12. The filtering circuit according to claim 8, wherein the current generator comprises a reference MOS transistor having its gate and its drain connected together, series-connected with a resistive charge between the supply voltage and the ground, the output of the current generator being taken at the drain of the transistor.

13. A microprocessor-based integrated circuit comprising:

- a microprocessor; and
- a filtering circuit comprising
- a stage for the generation of a first delay, comprising a first capacitor whose charging and discharging are controlled by a first control signal, one of the terminals of the first capacitor being connected to a first non-inverter level detector to deliver a first delay signal, the other terminal being connected to the ground;
- a stage to generate a second delay comprising a second capacitor whose charging and discharging are controlled by a second control signal, one of the terminals of the second capacitor being connected to a second non-inverter level detector to deliver a second delay signal, the other terminal being connected to the ground;
- a first NOR type logic gate receiving the first control signal and the first delay signal at input and delivering, at output, the second control signal which is the output pulse signal;
- a second NOR type logic gate receiving, at input, the input pulse signal, the output pulse signal and a locking signal controlled by the second delay signal and delivering, at output, the first control signal;

wherein the microprocessor receives the output pulse signal at an input thereof and outputs an inhibition signal relating to the use of this output pulse signal, the integrated circuit further comprising circuitry for the inhibition of the filtering circuit, the inhibition circuitry being controlled by the inhibition signal.

14. The integrated circuit according to claim 13, wherein the inhibition circuitry comprises a logic gate to inhibit the delay generation circuits, this logic gate receiving the inhibition signal and the second delay signal at input and delivering the locking signal at output.

15. The integrated circuit according to claim 13, wherein the inhibition circuitry has a logic circuit to inhibit the current generator, this circuit comprising:

- a switch-over transistor series-connected between the supply voltage VCC and the reference transistor of the current generator, and controlled at its gate by the output of a NAND gate receiving, at input, the inhibition signal, the output pulse signal and the inverted second delay signal.

16. The microprocessor-based integrated circuit of claim 13, wherein an RS type flip-flop circuit has its input connected to the output of the second NOR gate and delivers the first control signal at an output, its reset input being controlled by the second control signal.

17. An integrated circuit according to claim 16, wherein the inhibition circuitry comprises a logic gate to inhibit the delay generation circuits, this logic gate receiving the inhibition signal and the second delay signal at input and delivering the locking signal at output.

18. An integrated circuit according to claim 16, wherein the inhibition circuitry has a logic circuit to inhibit the current generator, this circuit comprising:

- a switch-over transistor series-connected between the supply voltage VCC and the reference transistor of the current generator, and controlled at its gate by the output of a NAND gate receiving, at input, the inhibition signal, the output pulse signal and the inverted second delay signal.

19. The microprocessor-based integrated circuit of claim 13, wherein the locking signal is delivered by an inverter receiving the second delay signal at input.

20. An integrated circuit according to claim 19, wherein the inhibition circuitry comprises a logic gate to inhibit the delay generation circuits, this logic gate receiving the inhibition signal and the second delay signal at input and delivering the locking signal at output.

* * * * *